United States Patent
Hazucha et al.

(10) Patent No.: US 7,161,404 B2
(45) Date of Patent: *Jan. 9, 2007

(54) SINGLE EVENT UPSET HARDENED LATCH

(75) Inventors: Peter Hazucha, Linkoping (SE); Krishnamurthy Soumyanath, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 96 days.

This patent is subject to a terminal disclaimer.

(21) Appl. No.: 10/742,436

(22) Filed: Dec. 19, 2003

(65) Prior Publication Data

US 2004/0130351 A1 Jul. 8, 2004

Related U.S. Application Data (63) Continuation of application No. 09/472,000, filed on Dec. 23, 1999, now Pat. No. 6,696,873.

(51) Int. Cl.
*H03K 3/289* (2006.01)

(52) U.S. Cl. .................. 327/203; 327/208; 327/218

(58) Field of Classification Search ............. 327/202, 327/203, 206, 218, 225, 208, 209, 210, 211, 327/212; 365/154, 156, 205

See application file for complete search history.

(56) References Cited

U.S. PATENT DOCUMENTS

| | | | |
|---|---|---|---|
| 4,656,368 A | 4/1987 | McCombs et al. | 307/272 |
| 4,785,200 A | 11/1988 | Huntington | 307/279 |
| 4,937,473 A | 6/1990 | Statz et al. | 307/443 |
| 4,956,814 A | 9/1990 | Houston | 365/154 |
| 5,111,429 A | 5/1992 | Whitaker | 365/156 |
| 5,198,699 A | 3/1993 | Hashimoto et al. | 307/270 |
| 5,204,990 A | 4/1993 | Blake et al. | 257/904 |
| 5,307,142 A | 4/1994 | Corbett et al. | 365/156 |
| 5,311,070 A | 5/1994 | Dooley | 307/279 |
| 5,349,255 A | 9/1994 | Patel | 307/593 |

(Continued)

FOREIGN PATENT DOCUMENTS

| | | | |
|---|---|---|---|
| JP | 61-79318 | 4/1986 | 327/212 |
| JP | 2-190018 | 7/1990 | 327/212 |

OTHER PUBLICATIONS

Calin, T., et al., "Upset Hardened Memory Design for Submicron CMOS Technology", *IEEE Transactions on Nuclear Science*, vol. 43, (Dec. 1996),2874-2877.

*Primary Examiner*—Tuan T. Lam
(74) *Attorney, Agent, or Firm*—Schwegman, Lundberg, Woessner & Kluth, P.A.

(57) ABSTRACT

A hardened latch capable of providing protection against single event upsets (SEUs) is disclosed. The hardened latch includes a first latch and a second latch that mirrors a subset of gates of the first latch. The second latch is inserted in the feedback path of the keeper circuit of the first latch and is cross-coupled with the gates of the keeper circuit of the first latch. The latch is hardened against single event upsets and an arbitrary number of successive SEUs attacking a single node, provided that the time between successive SEUs is larger than the recovery time of the latch. An alternate embodiment of the hardened latch includes a split buffer output. This embodiment is capable of reducing the propagation of erroneous transients. Another alternate embodiment of the hardened latch includes a Miller C buffer output. This embodiment is capable of reducing the propagation of erroneous transients below the level achievable in a hardened latch employing a split buffer output.

10 Claims, 7 Drawing Sheets

U.S. PATENT DOCUMENTS

| | | | |
|---|---|---|---|
| 5,406,513 A | 4/1995 | Canaris et al. | 365/181 |
| 5,491,429 A | 2/1996 | Gasparik | 326/27 |
| 5,504,703 A | 4/1996 | Bansal | 365/156 |
| 5,525,923 A | 6/1996 | Bialas, Jr. et al. | 327/210 |
| 5,631,863 A | 5/1997 | Fechner et al. | 365/156 |
| 5,640,341 A | 6/1997 | Bessot et al. | 365/156 |
| 5,646,558 A | 7/1997 | Jamshidi | 326/106 |
| 6,026,011 A | 2/2000 | Zhang | 365/154 |
| 6,215,694 B1 | 4/2001 | Li et al. | 365/156 |
| 6,278,287 B1 | 8/2001 | Baze | 326/9 |

SINGLE EVENT UPSET HARDENED LATCH

This application is a continuation of U.S. patent application Ser. No. 09/472,000, filed Dec. 23, 1999, now issued as U.S. Pat. No. 6,696,873, which is incorporated herein by reference.

FIELD OF THE INVENTION

This invention relates to information storage circuits, and more particularly to information storage circuits hardened to single event upsets.

BACKGROUND OF THE INVENTION

A Single Event Upset (SEU) changes the value of a bit in a logic circuit. Single Event Upsets (SEUs) are caused by natural radiation sources, such as alpha particles and cosmic rays, interacting with the transistors included in a logic circuit. Microprocessors are comprised of logic circuits, and SEUs are a significant source of soft errors in these circuits. Any circuit node to which either a drain or source of a metal-oxide semiconductor (MOS) transistor is attached can exhibit a random change of voltage due to an SEU, which may cause a soft error in the operation of the microprocessor. The consequence of a soft error is an unwanted change of state of a microprocessor beyond control of a user program, leading to processing and storage of corrupted data, modification of the execution flow and, in the worst case, crash of a system. Soft errors, as opposed to hard errors, do not cause physical damage to the underlying circuitry, although erroneous operation caused by soft errors can finally result in physical damage to the circuit itself or other parts of the system. As the dimensions of the transistors that make up microprocessors decrease and as the operating voltages of the microprocessors decrease, soft-errors due to SEUs are likely to increase. For many systems, such as server computers, airplanes, trains, and cars, which are controlled by microprocessors, reliable operation of the microprocessors is required, even in the presence of radiation and SEUs. A microprocessor failure in these systems can result in a system failure.

Combinational (memoryless) logic circuits can recover from an SEU because the inputs to those circuits are driven by uncorrupted signals. An SEU in a combinational circuit can lead to a soft error if a subsequent memory circuit reads a wrong output during the period of time while the combinational circuit is still recovering. Such an event requires synchronization of an SEU with the clock signal of the memory circuit and low logic depth from the upset node to the input port of the memory circuit. That is why combinational circuits exhibit a much lower soft error rate compared to memory circuits. However, memory devices, such as random-access memory (RAM) devices may not recover from an SEU.

Figure 1:
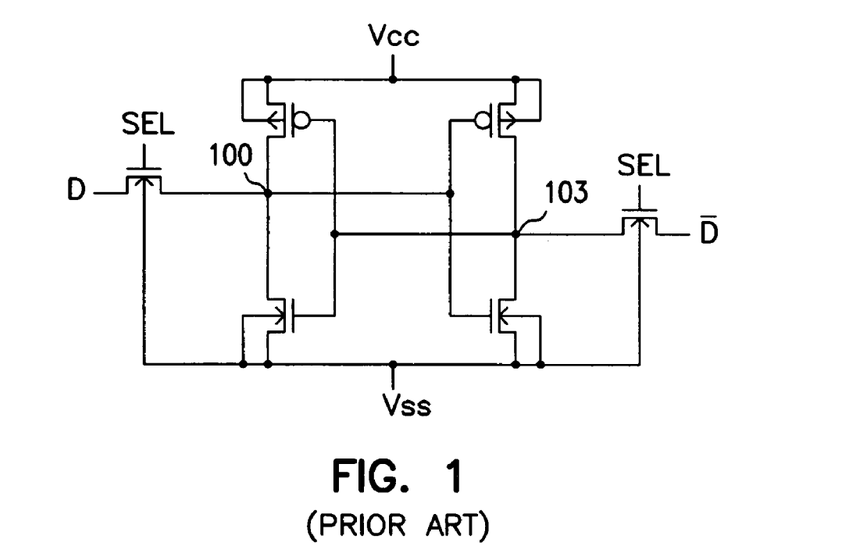
FIG. 1 is a schematic diagram of a prior art unhardened RAM cell.

FIG. 1 is a schematic diagram of a prior art RAM memory cell. The cell can store one information bit represented by one of the two possible stable states of the cell. In the first state, node 100 stores a logic value 0 and node 103 stores 1. In the second state, node 100 stores 1 and node 103 stores 0. A voltage change induced by an SEU on node 100 can propagate to node 103. When this occurs, the original information on nodes 100 and 103 is lost and the stored information bit is inverted. Therefore, this cell is not immune to SEUs.

Figure 2:
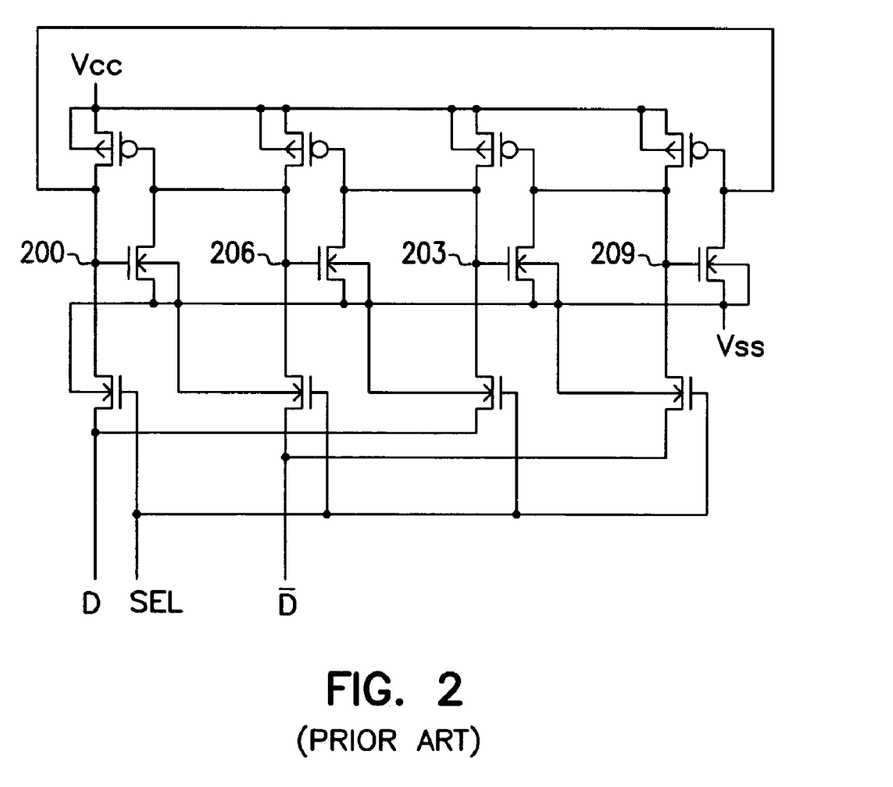
FIG. 2 is schematic diagram of a prior art hardened RAM cell.

FIG. 2 is a schematic diagram of a prior art hardened RAM cell. Nodes 200 and 203 correspond to node 100 of the RAM memory cell of FIG. 1, and nodes 206 and 209 correspond to node 103 of the RAM memory cell of FIG. 1. If one of the nodes 200, 203, 206, or 209 experiences an SEU, it will recover to its original state because of redundant information stored in the associated nodes. In one stable state, nodes 200 and 203 store 0 and nodes 206 and 209 store 1. An SEU at node 206 can change its logic value to 0. As a result, node 200 will be pulled up by a pMOS transistor with its gate attached to node 206. Logic values at nodes 203 and 209 remain intact. At the same time as node 206 is being pulled up by the pMOS transistor with its gate connected to node 203, node 200 is being pulled down by an nMOS transistor with its gate connected to node 209. This simultaneous recovery action forces nodes 200 and 206 to resume their original logic values prior to the SEU and the cell completely recovers. Unfortunately, duplication of a storage circuit, which is required by this solution, is very expensive in terms of area on an electronic chip. Moreover, the cell does not provide any means of filtering out temporarily incorrect data appearing at storage nodes 200, 203, 206, or 209 during the period of time while the cell is still recovering. The spurious output data can lead to soft errors in subsequent memory circuits if this cell is employed in a latch.

Figure 3:
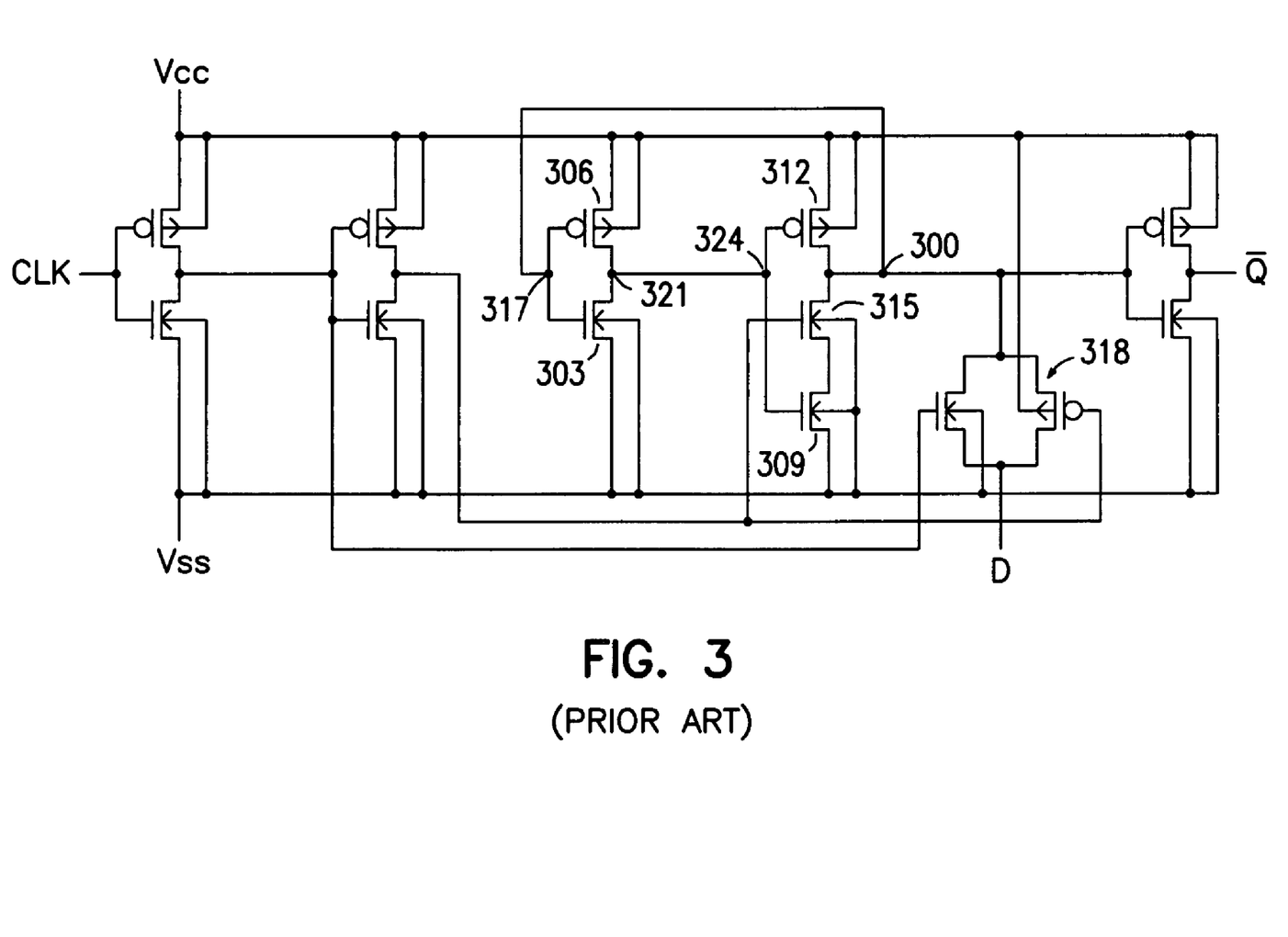
FIG. 3 is a schematic diagram of a prior art unhardened latch.

FIG. 3 is a schematic diagram of a prior art unhardened latch. The information stored at node 300 is maintained via a clocked keeper latch comprising gates 303, 306, 309, 312, and 315. An SEU at node 300 or 321 can change the state of the latch and destroy the stored information. One approach to reducing the effects of SEUs in latched storage devices rests on the characterization of SEUs as short duration pulse events. The amplitude of a short duration pulse that must traverse a long time constant resistor-capacitor (RC) circuit is decreased, and circuits following the RC circuit remain unaffected. For example, a one picosecond pulse event that must traverse an RC circuit having a one microsecond time constant has little effect at the output of the RC circuit. By applying this theory to the problem of hardening latches to SEUs, one or more long RC time constant circuits can be inserted between latch nodes, such as nodes 300 and 317 and nodes 321 and 324, to suppress short duration SEUs at nodes 300 and 317. Unfortunately, for some embodiments inserting a circuit having a long RC time constant between the nodes of a latch increases the write time of the latch.

For these and other reasons there is a need for the present invention.

SUMMARY OF THE INVENTION

A latch comprises a first latch and a second latch coupled to the first latch. The second latch is capable of hardening the latch to a single event upset.

DESCRIPTION OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

The present invention provides protection against single event upsets (SEUs) in a latch circuit. An SEU can result from ionizing radiation, such as alpha particles, striking a node in a latch. Protecting against single event upsets, or hardening a latch, restores a latch output to its original value after a single event upset. As described in greater detail below, transient signals resulting from single event upsets can also be suppressed by embodiments of the present invention.

Figure 4:
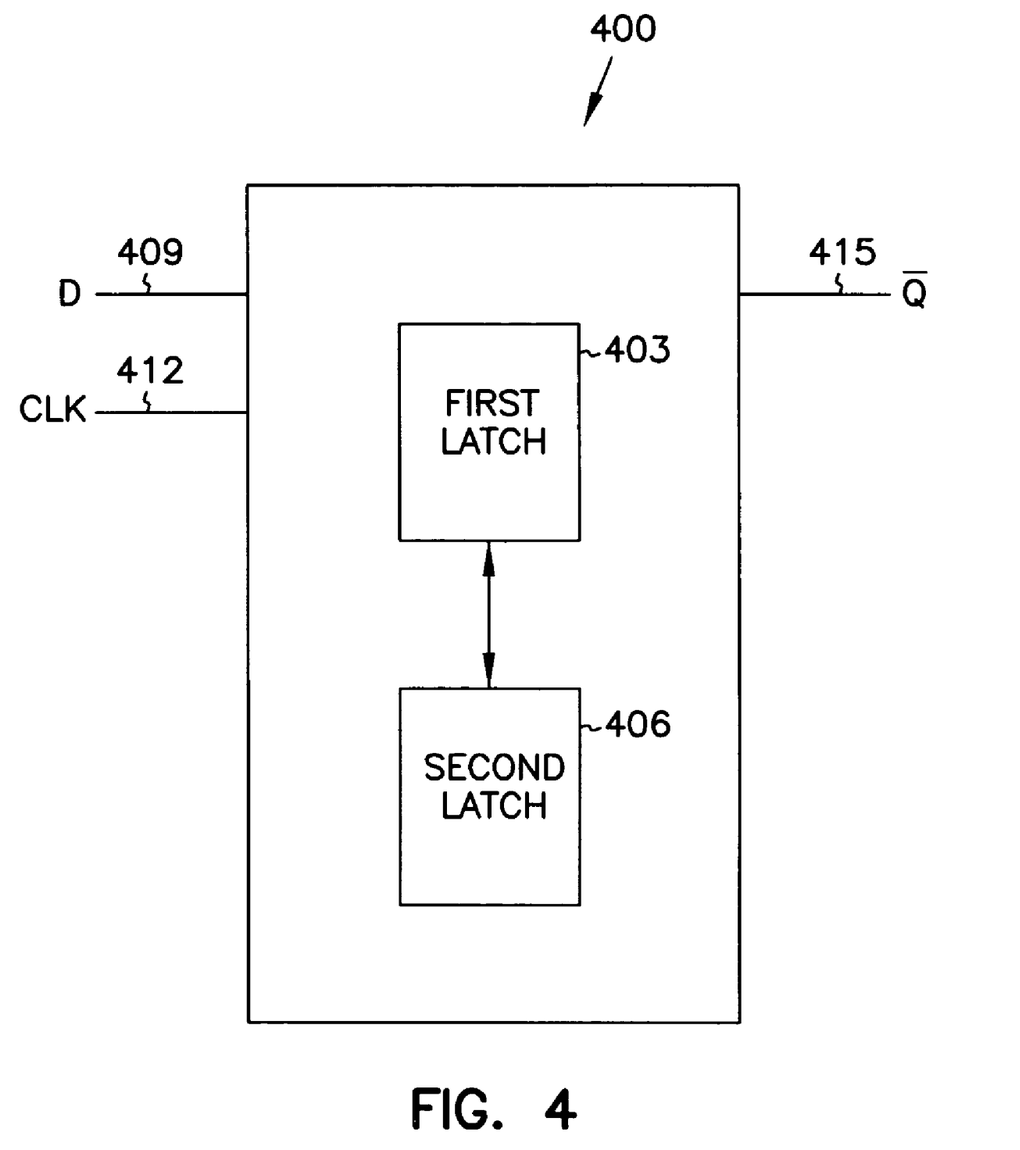
FIG. 4 is a block diagram of one embodiment of a hardened latch.

FIG. 4 is a block diagram of one embodiment of hardened latch 400 fabricated on a die using a complementary metal-oxide semiconductor (CMOS) manufacturing process. Hardened latch 400 includes first latch 403 coupled to second latch 406. Hardened latch 400 receives a data signal at input port 409 and a clock signal at input port 412 and generates data output signal $\overline{Q}$ at output port 415. In operation, for one embodiment, data contained in the data signal at input port 409 is stored in latch 400 on a rising edge of the clock signal at port 412. The stored data is available as data signal $\overline{Q}$ at output port 415. The stored data is protected from a single event upset (SEU) at a data storage node in either first latch 403 or second latch 406 by coupling first latch 403 to second latch 406. Hardened latch 400 is also immune to a series of SEUs occurring at internal data storage nodes of first latch 403 and second latch 406.

Figure 5:
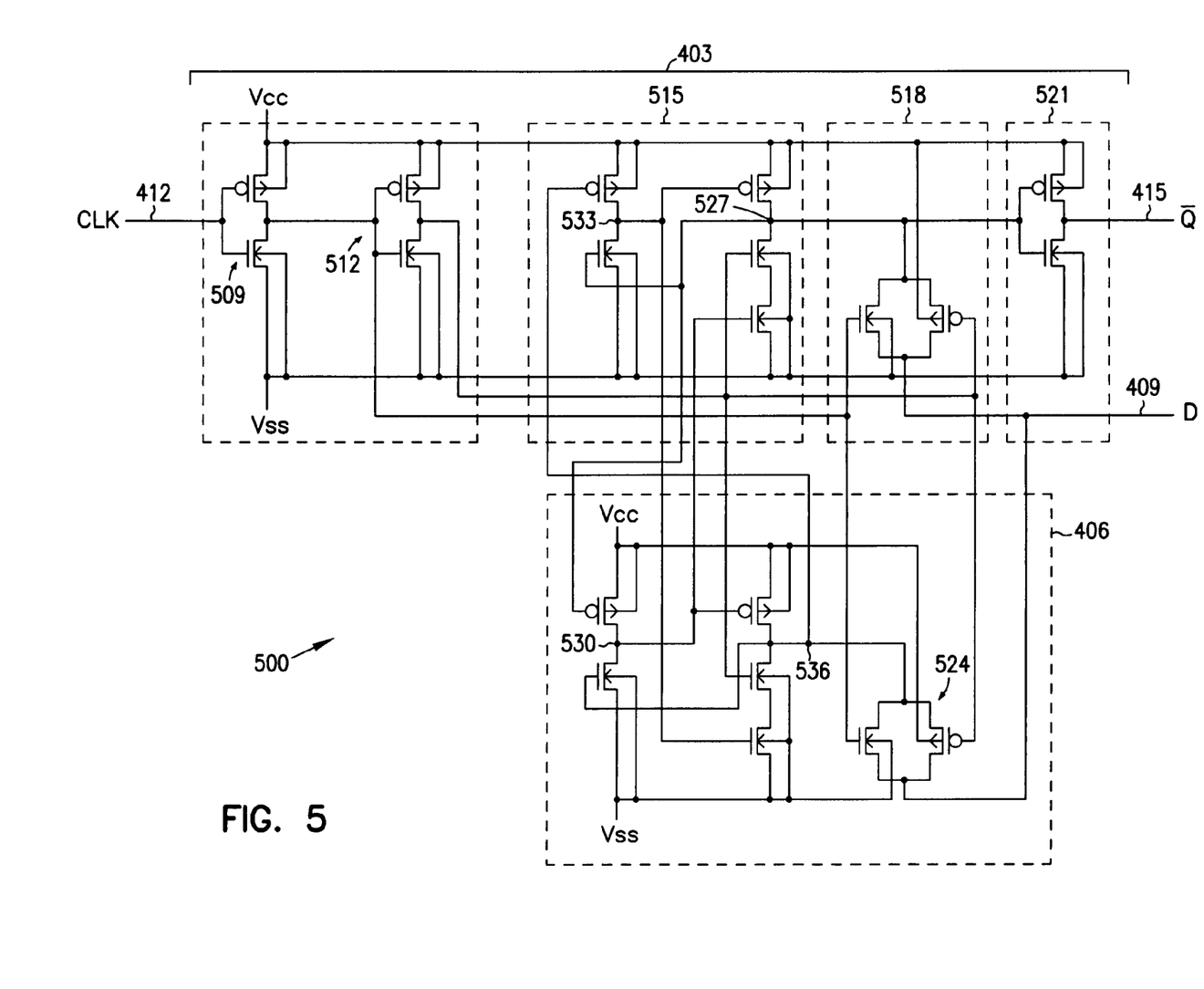
FIG. 5 is a schematic diagram of one embodiment of a hardened complementary metal-oxide semiconductor (CMOS) latch.

FIG. 5 is a schematic diagram of one embodiment of hardened CMOS latch system 500. Hardened CMOS latch 500 includes first latch 403 and second latch 406 as shown in FIG. 4. First latch 403 is an unhardened latch and includes the same logic gates as the unhardened latch shown in FIG. 3, and if operated independently of second latch 406 is susceptible to SEUs. First latch 403 includes clock inverters 509 and 512, keeper latch gates 515 coupled to clock inverters 509 and 512, transmission gate 518 coupled to keeper latch gates 515 and clock inverters 509 and 512, and output buffer 521 coupled to keeper latch gates 515. For one embodiment, second latch 406 mirrors keeper latch gates 515 and transmission gate 518. For an alternate embodiment, second latch 406 occupies an area on the substrate equal to the area occupied by keeper latch gates 515 and transmission gate 518. For still another embodiment, second latch 406 includes gates identical to the gates that comprise keeper latch gates 515 and transmission gate 518.

The gate interconnections of the unhardened latch of FIG. 3 are modified to permit coupling of second latch 406 to first latch 403 to form hardened latch 500. For one embodiment, three modifications are made. First, the data signal at input port 409 is coupled to second latch 406 to provide the same data to second latch 406 that is provided to first latch 403, and the clock signals at the output of clock inverters 509 and 512 are coupled to second latch 406 to provide the same clock signals to second latch 406 that are provided to keeper latch gates 515 and transmission gate 518. This arrangement of data and control signals permits synchronization of first latch 403 and second latch 406. Second, latch 406 is inserted in the feedback path of keeper latch gates 515. The output of keeper latch gates 515 at node 527 is connected to the input of second latch 406, and the output of second latch 406 at node 530 is connected to the input of keeper latch gates 515. So, effectively the feedback path for keeper latch gates 515 is cut and second latch 406 is inserted in the feedback path. Third, the output of the first stage of keeper latch gates 515 is coupled to an input of the second stage of latch 406, and the output of the first stage of keeper latch gates 515 is coupled to an input of the second stage of keeper latch gates 515. In this way, the data signal paths of keeper latch gates 515 are cross-coupled with second latch 406.

In operation, writing to hardened latch 500 is performed via transmission gates 518 and 524. The latch is protected for an SEU occurring on a single internal node, which implies that at least two nodes have to be modified simultaneously in order to change the state of latch 500. Transmission gates 518 and 524 are sized so that the gate delay of the two gates is equal. For one embodiment, the size of each of the transmission gates 518 and 524 is equal to the size of the transmission gate 318 of the unhardened latch shown in FIG. 3. Output buffer 521 is sized so that when coupled to transmission gates 518 and 524 only a small increase in the D to $\overline{Q}$ delay is incurred when compared with the D to $\overline{Q}$ delay of the unhardened latch shown in FIG. 3. For one embodiment, output buffer 521 includes two output buffer transistors and the size of each of the two output buffer transistors is equal to the size of the output buffer transistors of the unhardened latch shown in FIG. 3.

Hardened latch 500 recovers from an SEU on a single node, and hardened latch 500 will also recover from an arbitrary number of successive SEUs attacking a single node, provided that the time between successive SEUs is larger than the recovery time of the latch. For example, in one stable state latch 500 stores logic value 1 on nodes 527 and 536 and logic value 0 on nodes 530 and 533. An SEU on node 527 changes its value to 0 and this change propagates to node 530, which assumes value 1. Nodes 533 and 536 store their correct values dynamically. The gate of the pull-down nMOS transistor of node 530 is connected to node 536. Node 536 stores 1 and there is contention between the nMOS and pMOS transistor driving node 530. This contention prevents node 530 from reaching a full-rail voltage, either Vcc or Vss. At the same time, the pull-up pMOS transistor of node 527 attempts recovery of node 527. As the voltage on node 527 gradually rises, resistance of the pull-up pMOS transistor of node 530 increases, leading to recovery of node 530 to value 0. The recovery process of node 530 supports recovery of node 527, because resistance of the pull-down nMOS transistor of node 527 increases as the voltage on node 530 approaches Vss. Eventually, node 530 recovers to 0 and node 527 recovers to 1. In a similar way, latch 500 recovers from an SEU occurring on other internal nodes and latch 500 is immune to SEUs for both stable states. However, if the data stored at node 527 changes either directly as a result of an SEU occurring at node 527 or indirectly as a result of an SEU occurring at either node 533 or node 530, the data at output port 415 may be erroneous until node 527 recovers from the SEU. For example, if the original bit stored at node 527 is 1, then the bit stored on node 530 is 0 and the output data at output port 415 is 0. An SEU occurring at node 530 causes the voltage at node 530 to rise, which causes the pull-down nMOS transistor connected to node 527 to close and change the value of the bit stored at node 527 from 1 to 0 and the output data at output port 415 from 0 to 1. Similarly, if the bit stored on node 527 is 0, then the bit stored on node 533 is 1, and the output data at output port 415 is 1. An SEU on either node 527 or 533 causes the voltage at node 527 to rise and results in erroneous data at output port 415. The data at output port 415 is erroneous only until the latch recovers from the SEU and the information bit stored at node 527 assumes its correct value, but during this time, the erroneous data may be propagated through subsequent logic stages. This temporary appearance of erroneous data is similar to a logic state glitch and is further mitigated in the alternate embodiment described below.

Figure 6:
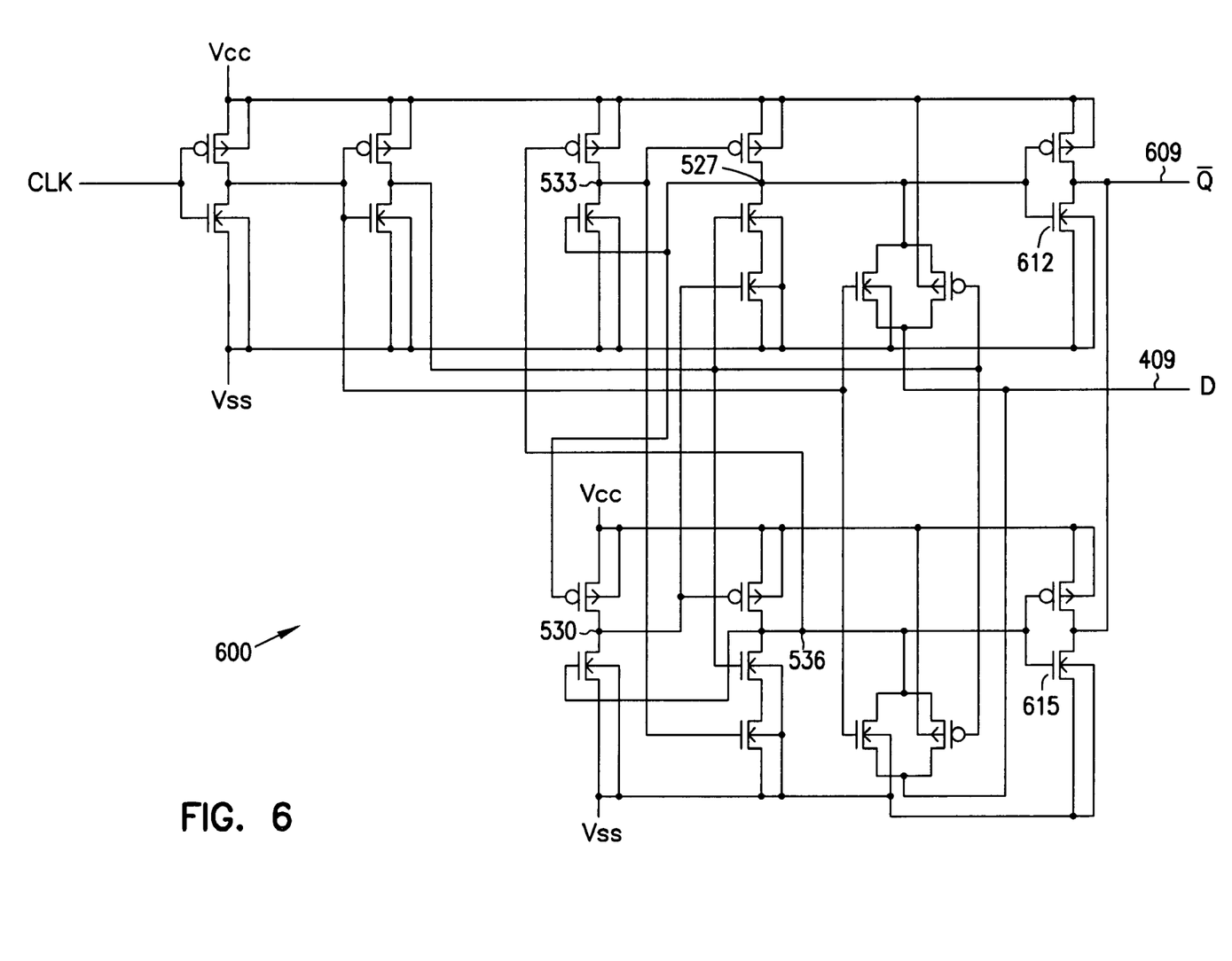
FIG. 6 is a schematic diagram of an alternate embodiment of a hardened latch having a split output buffer.

FIG. 6 is a schematic diagram of an alternate embodiment of a hardened latch having an output port 609 driven by split output buffers 612 and 615. The SEU performance of hardened latch 600 is superior to the SEU performance of hardened latch 500 shown in FIG. 5. Both hardened latches 500 and 600 always recover from an SEU attacking a single node at a time. And both hardened latches 500 and 600 recover from successive SEUs attacking a single node, provided that the time between successive SEUs is larger than the recovery time of the latch. However, hardened latch 600 propagates to output port 609 only 50% of the spurious transitions that result from SEUs, while hardened latch 500 propagates all spurious transitions to output port 609 that result from SEUs. Hardened latch 600 therefore reduces the amount of erroneous data that could be propagated to logic circuits coupled to output port 609.

The output buffer configuration of hardened latch 600 includes split buffers 612 and 615, which are intended to simultaneously drive output port 609. In the absence of SEUs, the information bits at nodes 527 and 536 have the same value. Since all voltage transitions at buffers 612 and 615 are intended to occur simultaneously, to avoid contention between buffers 612 and 615, the sizing and topology of buffers 612 and 615 are symmetrical. For one embodiment, the size of each of the transistors that make up output buffers 612 and 615 is equal to one-half the size of the corresponding transistor in output buffer 512 of FIG. 5.

At one stable state, nodes 527 and 536 store 1 and nodes 530 and 533 store 0. The output value at port 609 is 0. An SEU on either node 527 or 530 results in node 527 having value 0 and node 530 having value 1, because of coupling between nodes 527 and 530. Output buffer 612 attempts to drive output port 609 high. Nodes 533 and 536 retain their original values 0 and 1, respectively. Output buffer 615 attempts to hold output port 609 at its correct value 0. There is a contention between buffer 612 and 615. In one embodiment, the nMOS and pMOS transistors of buffers 612 and 615 are sized so that the D to $\overline{Q}$ delay is minimized. The pMOS transistor of buffer 612 is weaker than the nMOS transistor of buffer 615 and output port 609 preserves its correct value 0 only marginally degraded. An SEU on either node 533 or node 536 results in node 536 having value 0 and node 533 having value 1, because of coupling between nodes 536 and 533. Buffer 615 attempts to raise the voltage on output port 615. Nodes 527 and 530 retain their original values 1 and 0, respectively. The pMOS transistor of buffer 615 is weaker than the nMOS transistor of buffer 612 and output port 609 retains its correct value 0 only marginally degraded. In this stable state corresponding to logic value 0 at output port 609, transients at output port 609 are suppressed.

At another stable state, nodes 527 and 536 store 0 and nodes 530 and 533 store 1. An SEU on node 533 changes its value to 0 and node 527 is driven high by the pMOS transistor coupled to node 533. Node 530 remains at 1 and there is contention between the pMOS and nMOS transistors driving node 527. The voltage of node 527 will be close to 50% of the supply voltage. Output buffer 612 can neither pull up nor pull down output port 609, because both nMOS and pMOS transistors of buffer 612 are only partially conducting. Node 536 stores value 0 and the pMOS transistor of buffer 615 receives full-rail gate voltage. As a result, output port 609 remains at correct value 1 only marginally degraded. Similarly, an SEU on node 530 cannot propagate to output port 609.

An SEU on node 527 changes its value from 0 to 1 and the nMOS transistor of output buffer 612 attempts to pull output port 609 to 0. Node 536 remains at 0 and buffer 615 attempts to preserve the correct value 1 at output port 609. The nMOS transistor of buffer 612 can receive full-rail gate voltage, as a result of an SEU on node 527. Output buffer 612 can propagate an incorrect value to output port 609. Similarly, an SEU on node 536 can propagate to output port 609.

When output port 609 stores 0, hardened latch 600 suppresses all transients. When output port 609 stores 1, hardened latch 600 suppresses transients from SEUs on node 533 and 530 and potentially propagates transients from SEU on nodes 527 and 536. If the two stable states occur with equal probability, then during 50% of time, transients from an SEU on one of the two nodes propagate to output port 609.

In case of hardened latch 500, transients from an SEU on node 527 and either node 533 or node 530 (not both at the same time) can propagate to output port 415. In case of hardened latch 500, at any time, transients from an SEU on one of two nodes can propagate to output port 415. However, latch 600 can propagate transients from an SEU on one of two nodes only during 50% of time.

Thus, the probability of a propagated error in subsequent logic stages is reduced by about 50% for the hardened latch in FIG. 6 when compared with the hardened latch of FIG. 5, and at the same time the D to $\overline{Q}$ delay of the latch of FIG. 6 is smaller than the corresponding delay of the hardened latch of FIG. 5. In addition, with all other transistor sizes equal to the sizes of the unhardened latch shown in FIG. 3, there is no penalty on D to $\overline{Q}$ delay, and setup and hold times of the latch in FIG. 5 or the latch in FIG. 6. Depending on the size of the transistors of split buffers 612 and 615, the penalty on area and power consumption is typically about 50%.

Figure 7:
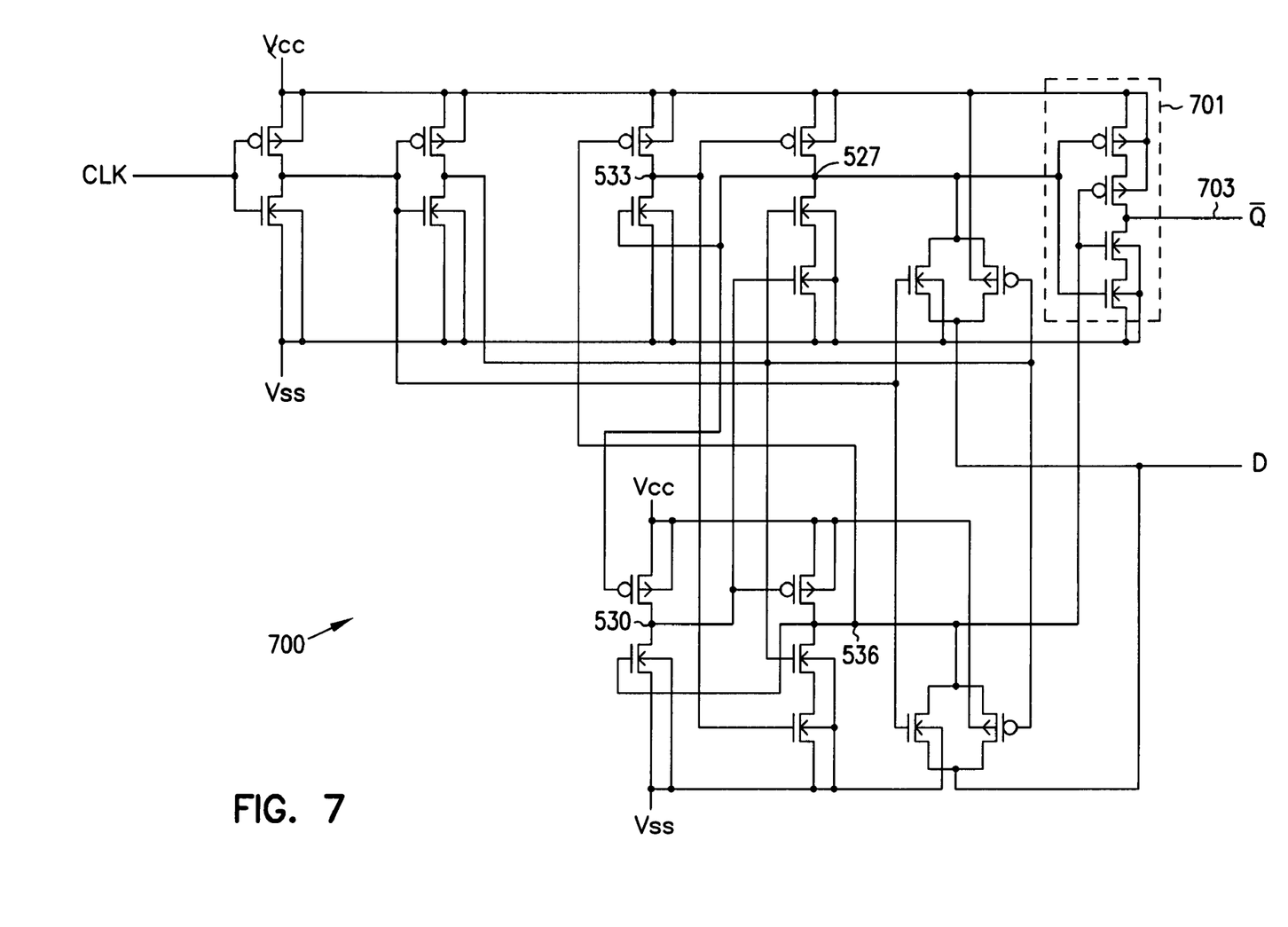
FIG. 7 is a schematic diagram of one embodiment of a hardened latch having a Miller C output buffer.

FIG. 7 is a schematic diagram of an alternate embodiment of hardened latch 700 having Miller C output buffer 701. The SEU performance of hardened latch 700 is superior to the SEU performance of either hardened latch 500 or hardened latch 600. An SEU can modify at most one of the nodes 527 and 536 at a time. The output port 703 can be modified only if both nodes 527 and 536 change simultaneously, which is possible only during writing into the cell via transmission gates 518 and 524. During the recovery time, the bit value stored at output port 703 retains its original value dynamically. A drawback of hardened latch of FIG. 7 is that the D to $\overline{Q}$ delay approximately doubles, while the setup and hold times remain essentially unchanged compared to the hardened latches shown in FIGS. 5 and 6.

Figure 8:
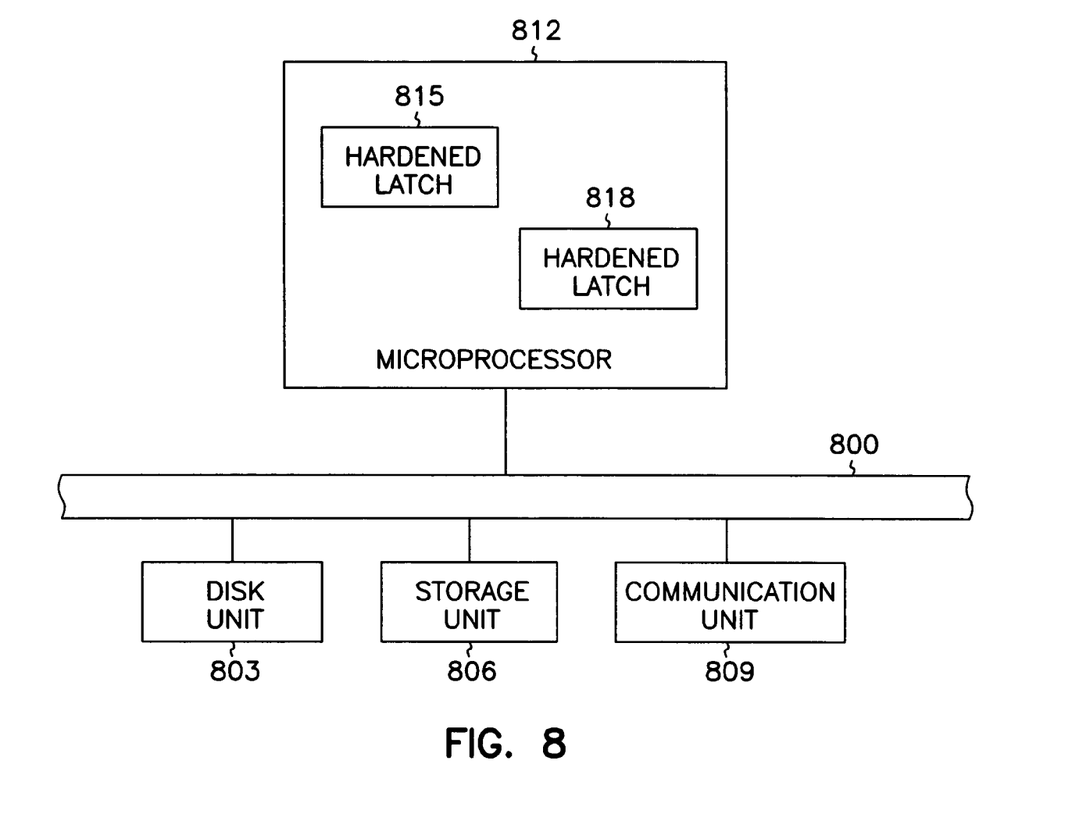
FIG. 8 is a system diagram of a bus coupled to electronic units including a processor having hardened latches.

FIG. 8 is a system diagram of a bus 800 coupled to electronic units 803, 806, and 809 and processor 812 having hardened latches 815 and 818. Electronic units 803 include, for example, disk units, storage units, and communications units. For one embodiment, processor 812 is a single chip microprocessor. Alternatively, processor 812 is a multi-chip microprocessor system. Hardened latches 815 and 818, for one embodiment, are CMOS latches including redundant keeper circuits for immunizing the latches to SEUs. The output buffers of latches 815 and 818, for one embodiment are split buffers. Alternatively, the output buffers of latches 815 and 818 are Miller C output buffers.

Although specific embodiments have been illustrated and described herein, it will be appreciated by those of skill in the art that any arrangement which is calculated to achieve the same purpose may be substituted for the specific embodiment shown. This application is intended to cover any adaptations or variations of the present invention. Therefore, it is intended that this invention be limited only by the claims and the equivalents thereof.

What is claimed is:

1. A latch circuit, comprising:
a first latch; and
a second latch to harden the latch circuit to a single event upset, the second latch including a transmission gate including two transistors, the transmission gate having an output port to couple to only one transistor of the first latch; and a Miller C buffer to couple to the second latch.

2. A die comprising:
a first latch having a feedback path; and
a second latch including a transmission gate including two transistors, the transmission gate located in the feedback path to render the die immune to single event upsets attacking a single node at a time; and a Miller C buffer to couple to the second latch.

3. A method, comprising:
setting a hardened latch having a latched node to an initial value;
receiving a single event upset at the latched node;
overriding the single event upset with a second latched value to return the output value at the latched node to the initial value; and
presenting the output value at a Miller C buffer.

4. The method of claim 3, further comprising:
receiving a series of single event upsets at the latched node; and
overriding at least about 50% of the series of single event upsets with a second latched value to return the output value at the latched node to the initial value.

5. A method of claim 3, further comprising:
receiving ionizing radiation at the latched node.

6. The method of claim 3, further comprising:
propagating less than about 50% of spurious transients to the Miller C buffer.

7. A system, comprising:
a bus;
at least one electronic unit to couple to the bus; and
a processor to couple to the bus, the processor including a plurality of hardened latches for reducing a plurality of spurious transients induced by at least one single event upset event, wherein at least one of the plurality of hardened latches includes a Miller C output buffer.

8. The system of claim 7, wherein at least one of the plurality of hardened latches comprises:
a first latch; and
a second latch to harden the at least one of the plurality of hardened latches to a single event upset, the second latch including a transmission gate having an output port to couple to only one transistor of the first latch.

9. The system of claim 7, wherein at least one of the plurality of hardened latches comprises:
a first latch having a feedback path; and
a second latch including a transmission gate including two transistors, the transmission gate located in the feedback path to render the processor immune to single event upsets attacking a single node at a time.

10. The system of claim 7, wherein at least one of the plurality of hardened latches comprises:
an input gate;
a first latch having a first set of gates, the first latch to couple to the input gate;
a second latch having a second set of gates identical to the first set of gates, the second latch to couple to the first latch and the input gate.

* * * * *